(12) United States Patent
Ma et al.

(10) Patent No.: US 9,331,659 B2
(45) Date of Patent: May 3, 2016

(54) INTEGRATED CIRCUIT ARCHITECTURE WITH STRONGLY COUPLED LC TANKS

(75) Inventors: Kai Xue Ma, Singapore (SG);
Nagarajan Mahalingam, Singapore (SG); Shouxian Mou, Singapore (SG);
Kiat Seng Yeo, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 13/880,499

(22) PCT Filed: Oct. 21, 2011

(86) PCT No.: PCT/SG2011/000370
§ 371 (c)(1),
(2), (4) Date: Aug. 1, 2013

(87) PCT Pub. No.: WO2012/053983
PCT Pub. Date: Apr. 26, 2012

(65) Prior Publication Data
US 2013/0307630 A1    Nov. 21, 2013

Related U.S. Application Data

(60) Provisional application No. 61/405,244, filed on Oct. 21, 2010.

(51) Int. Cl.
*H03B 5/12* (2006.01)
*H03B 19/00* (2006.01)
(Continued)

(52) U.S. Cl.
CPC ........... *H03H 7/0115* (2013.01); *H03B 5/1215* (2013.01); *H03B 5/1218* (2013.01); *H03B 5/1228* (2013.01); *H03B 5/1243* (2013.01); *H03B 5/1265* (2013.01); *H03B 5/1296* (2013.01); *H03B 19/00* (2013.01);
(Continued)

(58) Field of Classification Search
CPC ...... H03B 19/00; H03B 19/12; H03B 5/1296; H03B 5/1237; H03B 5/1256; H03B 5/1265; H03B 5/124; H03B 2200/0074; H03B 2201/02
USPC ...... 331/117 R, 117 FE, 167, 172, 47, 50, 55, 331/51; 327/117
See application file for complete search history.

(56) References Cited

U.S. PATENT DOCUMENTS 7,154,349 B2 *  12/2006  Cabanillas ................ 331/117 R
7,518,458 B2 *   4/2009  Nakamura et al. ............ 331/167
(Continued)

OTHER PUBLICATIONS

Office Action dated Oct. 13, 2015 from Taiwan patent application No. 100138552.

*Primary Examiner* — Ryan Johnson
(74) *Attorney, Agent, or Firm* — K. David Crockett, Esq.; Niky Economy Syrengelas, Esq.; Crockett & Crockett, PC

(57) ABSTRACT

An integrated circuit for a radio frequency (RF) circuit such as a voltage controlled oscillator or an injection locked frequency divider is provided. The integrated circuit architecture includes a primary LC tank circuit comprising a first inductor and a first capacitive device connected in parallel and one or more secondary LC tank circuits, each comprising an inductor and a capacitive device connected in parallel. Each of the one or more secondary LC tank circuits is strongly coupled to the primary LC tank circuit and to each other either electrically, magnetically or a combination of electrically and magnetically.

6 Claims, 16 Drawing Sheets

(51) Int. Cl.
*H03H 7/01* (2006.01)
*H03J 3/20* (2006.01)
*H03L 7/00* (2006.01)

(52) U.S. Cl.
CPC .. *H03J 3/20* (2013.01); *H03L 7/00* (2013.01); *H03B 2200/0074* (2013.01); *H03J 2200/10* (2013.01)

(56) References Cited

U.S. PATENT DOCUMENTS

| | | | | |
|---|---|---|---|---|
| 7,961,058 | B2 * | 6/2011 | Luong et al. | 331/74 |
| 8,410,830 | B2 * | 4/2013 | Mahdavi | 327/118 |
| 2009/0261868 | A1 | 10/2009 | Lu et al. | |

* cited by examiner (1)

(2)

(3)

(1)

(2)

(3)

INTEGRATED CIRCUIT ARCHITECTURE WITH STRONGLY COUPLED LC TANKS

CROSS-REFERENCE TO RELATED APPLICATION

The present application claims priority to U.S. Provisional Patent Application No. 61/405,244, filed Oct. 21, 2010.

FIELD OF THE INVENTION

The present invention generally relates to integrated circuit architecture including multiple LC tanks, and more particularly relates to circuits such as voltage controlled oscillators or injection locked frequency dividers which include multiple LC tanks.

BACKGROUND OF THE DISCLOSURE

Typically, a radio frequency (RF) communication device includes an RF front end which, more recently, has been enabled in a RF integrated circuit. The RF front end, conventionally, has a signal source, in most cases a voltage controlled oscillator (VCO), which is ubiquitous with modern transceivers and forms an integral part of frequency synthesizers or Phase Locked Loops (PLLs). The performance of the VCO may have an effect in the overall performance of the system if not properly designed. For example, very low phase noise or very wide tuning range with low tuning sensitivity or excellent flatness for power output versus frequency change or freedom from power compression is required with low power consumption and is critical for next generation wireless applications. It is often very challenging to combine all the best performances without much tradeoff which makes the design of such VCO very difficult.

High performance VCOs generally include a tank circuit which is formed by the parallel combination of inductance and capacitance and which plays an important role in all the performance metrics. Typically wide tuning range is achieved by varying the capacitance in the tank circuit using some kind of switching element. Generally, however, the phase noise is compromised with the tuning range which in turn is compromised with power consumption.

In a synthesizer or a signal source, modern design techniques tend to lock a high frequency output signal to a low frequency reference using phase locked loops (PLLs). A frequency divider is required to form such PLLs. Conventionally, an injection locked frequency divider (ILFD) having a predetermined frequency division ratio can be designed with low power consumption and low phase noise. However, such typical ILFDs have a relative narrow operation frequency range.

Thus, what is needed is an integrated circuit architecture for RF circuits which could provide VCOs which address the performance issues of VCOs individually, while providing an improved oscillator circuit which can concurrently meet the requirements of high performance. In addition, what is needed is an ILFD which provides low power consumption and low phase noise while providing a broadened operating frequency range. Furthermore, other desirable features and characteristics will become apparent from the subsequent detailed description and the appended claims, taken in conjunction with the accompanying drawings and this background of the disclosure.

SUMMARY

According to the Detailed Description, an integrated circuit architecture for a radio frequency (RF) circuit is provided. The integrated circuit architecture includes a primary and one or more secondary LC tank circuits. The one or more secondary LC tank circuits are strongly coupled to the primary LC tank circuit and to each other either magnetically, electrically or a combination of magnetic and electric coupling.

In addition, a voltage controlled oscillator for a radio frequency (RF) circuit is provided. The voltage controlled oscillator includes a primary and one or more secondary coupled LC tank circuits. Each LC tank circuit of the primary and one or more secondary LC tank circuits includes an inductor and a capacitive device connected in parallel. Between or among the primary and one or more secondary coupled LC tank circuits, there exists strong electric or magnetic coupling or a combination of electric and magnetic coupling.

Further, an injection locked frequency divider having a predetermined frequency division ratio is provided. The injection locked frequency divider includes a primary and one or more secondary LC tank circuits. Each LC tank circuit of the primary and the one or more secondary coupled LC tank circuits includes an inductor and a capacitive device connected in parallel. Each LC tank circuit of the primary and the one or more secondary coupled LC tank circuits is strongly coupled to each other for band pass filtering an input frequency to generate an output frequency filtered in accordance with the predetermined frequency division ratio.

BRIEF DESCRIPTION OF THE DRAWINGS

The accompanying figures, where like reference numerals refer to identical or functionally similar elements throughout the separate views and which together with the detailed description below are incorporated in and form part of the specification, serve to illustrate various embodiments and to explain various principles and advantages in accordance with the present invention.

FIG. 4, comprising

FIG. 5, comprising

FIGS. 16A and 16B, are circuit diagrams of two additional injection locked frequency divider circuits in accordance with the present embodiment;

Skilled artisans will appreciate that elements in the figures are illustrated for simplicity and clarity and have not necessarily been drawn to scale. For example, the dimensions of some of the elements in the figures illustrating integrated circuit architecture may be exaggerated relative to other elements to help to improve understanding of embodiments of the present invention.

DETAILED DESCRIPTION

The following detailed description is merely exemplary in nature and is not intended to limit the invention or the application and uses of the invention. Furthermore, there is no intention to be bound by any theory presented in the preceding background of the invention or the following detailed description of the invention.

The present embodiment relates to a design of a radio frequency (RF)/Microwave/Millimeter-wave wideband voltage controlled oscillator (VCO) such as those intended for use in wireless communication applications for IEEE 802 (e.g., WiFi, WiMax, LTE, and IEEE 802.11ad) and applications for other commercial and military communications where high performance is required. High performance VCOs generally include a tank circuit which is formed by the parallel combination of inductance and capacitance. The present embodiment is a design of a VCO which can achieve quality performance with optimum tradeoff and is suitable for today's wireless applications. Many VCOs have been implemented in integrated circuits (ICs) to address particular performance parameters. In high performance VCOs the issue of achieving wide tuning range is solved by breaking the whole frequency range into smaller bands. One widely used technique is by using single inductor and multiple capacitors in the tank circuit.

The present embodiment provides a general solution to the problem of optimizing the performance of a wide range variable frequency low noise RF/Microwave/Millimeter-wave oscillator by identifying one performance parameter that when optimized also essentially optimizes others. The general solution for optimizing over wide tuning range switches a tank circuit containing parallel combination(s) of inductor(s) and capacitor(s). A more advantageous solution optimally tunes the inductor(s) and capacitor(s) without a switch through magnetic coupling, electric coupling or a combination of both magnetic and electric coupling (hybrid), and this tank circuit is hereafter referenced as a LC tank. The number of LC tanks that can be coupled can be from 2 to N.

Figure 1:
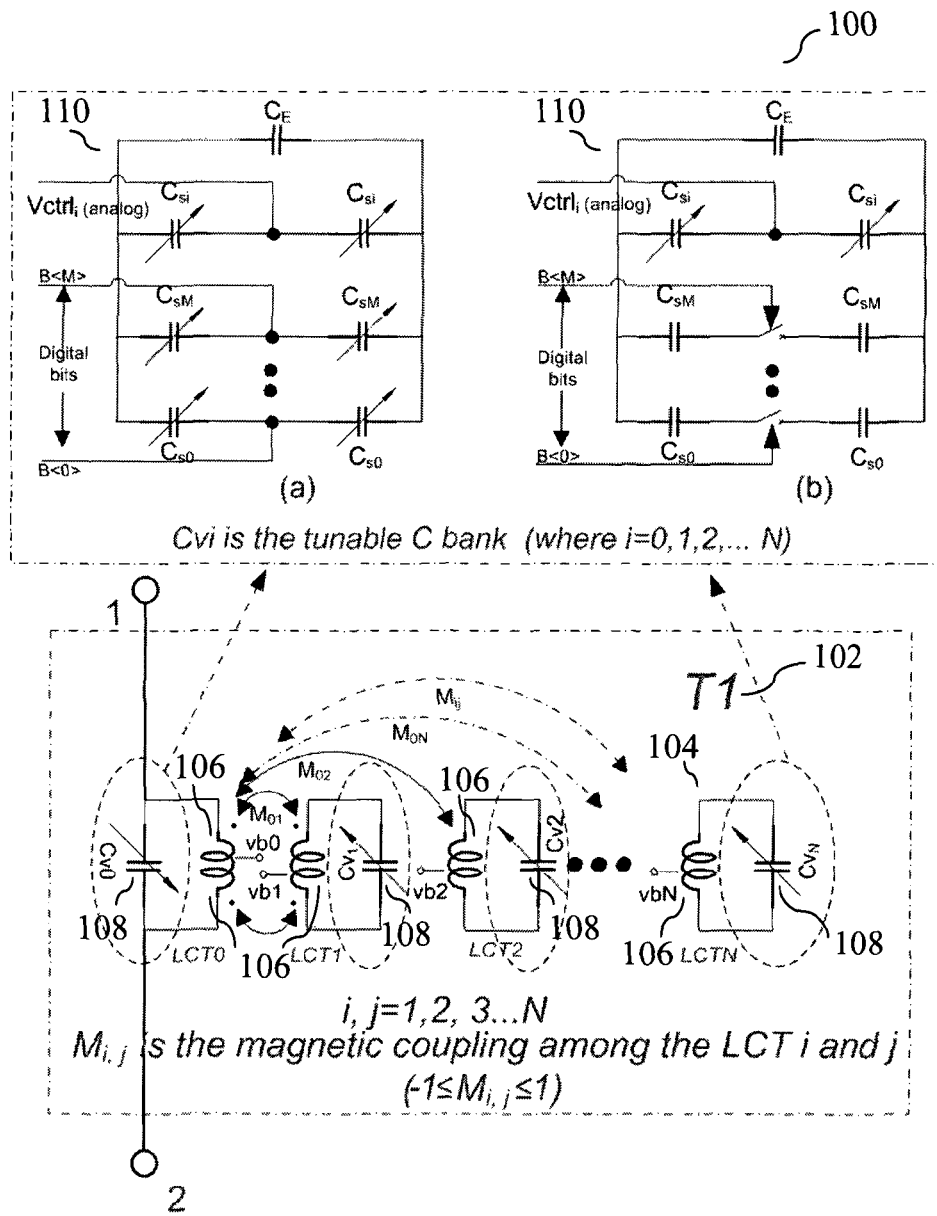
FIG. 1 is a circuit diagram depicting a strong magnetic coupled LC tank circuit architecture in accordance with a present embodiment.

Referring to FIG. 1, a circuit diagram 100 depicts a strong magnetic coupled LC tank array (T1) 102 in accordance with a present embodiment. The tank circuit 102 includes a plurality of LC tank circuits 104 magnetically coupled to one another. Each of the LC tank circuits 104 includes an inductor 106 and a capacitive device 108, and the magnetic coupling is between the inductors 106 of each of the LC tank circuits 104. The capacitive device 108 includes one or more tunable capacitor banks 110 as shown in (a) or (b).

Figure 2:
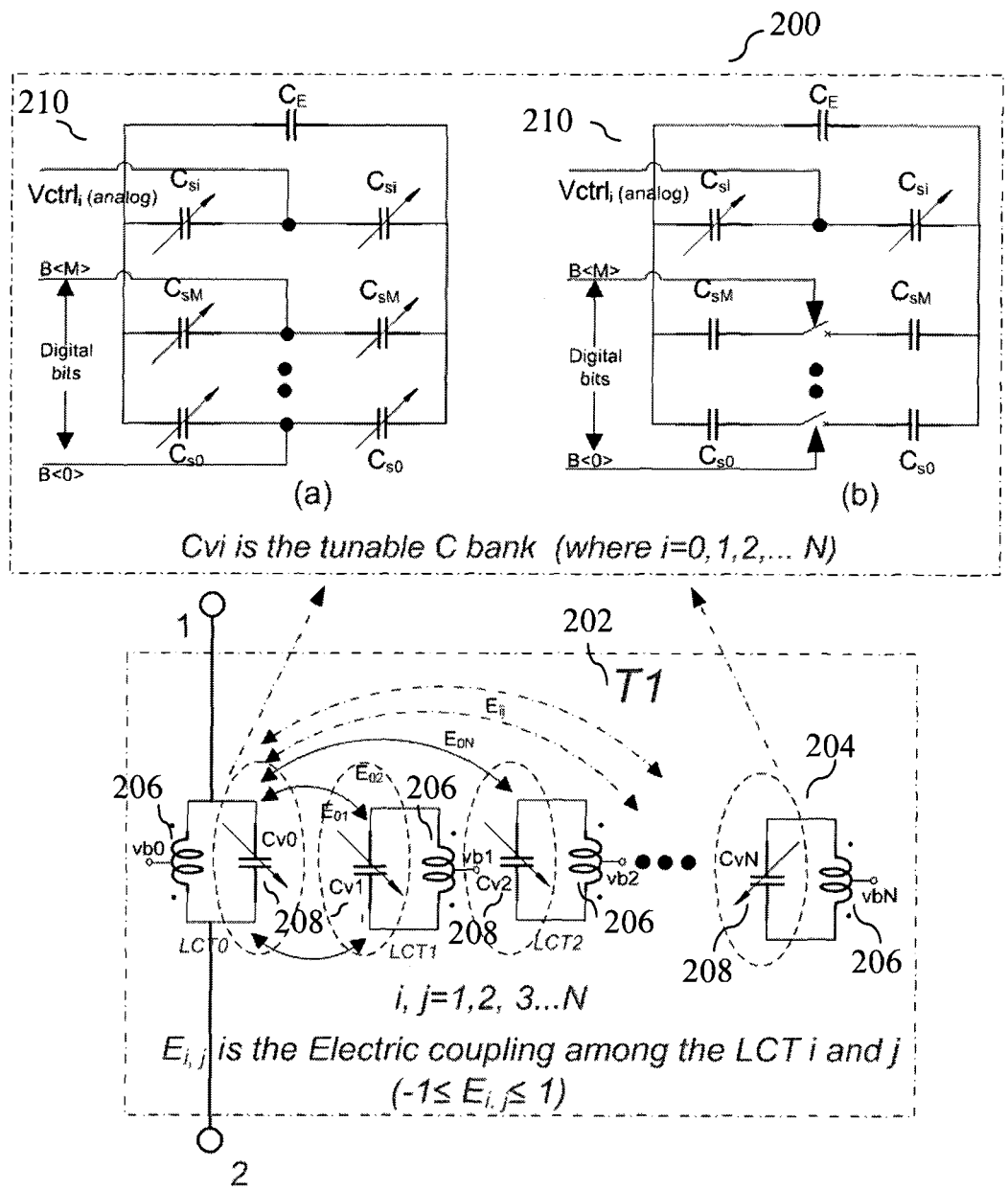
FIG. 2 is a circuit diagram depicting a strong electric coupled LC tank circuit architecture in accordance with a present embodiment.

Referring to FIG. 2, a circuit diagram 200 depicts a strong electrically coupled LC tank array (T1) 202 in accordance with the present embodiment. The tank circuit 202 includes a plurality of LC tank circuits 204 electrically coupled to one another. Each of the LC tank circuits 204 includes an inductor 206 and a capacitive device 208, and the electrical coupling is between the capacitive devices 208 of each of the LC tank circuits 204. The capacitive devices 208 include one or more tunable capacitor banks 210 as shown in (a) or (b).

Figure 3:
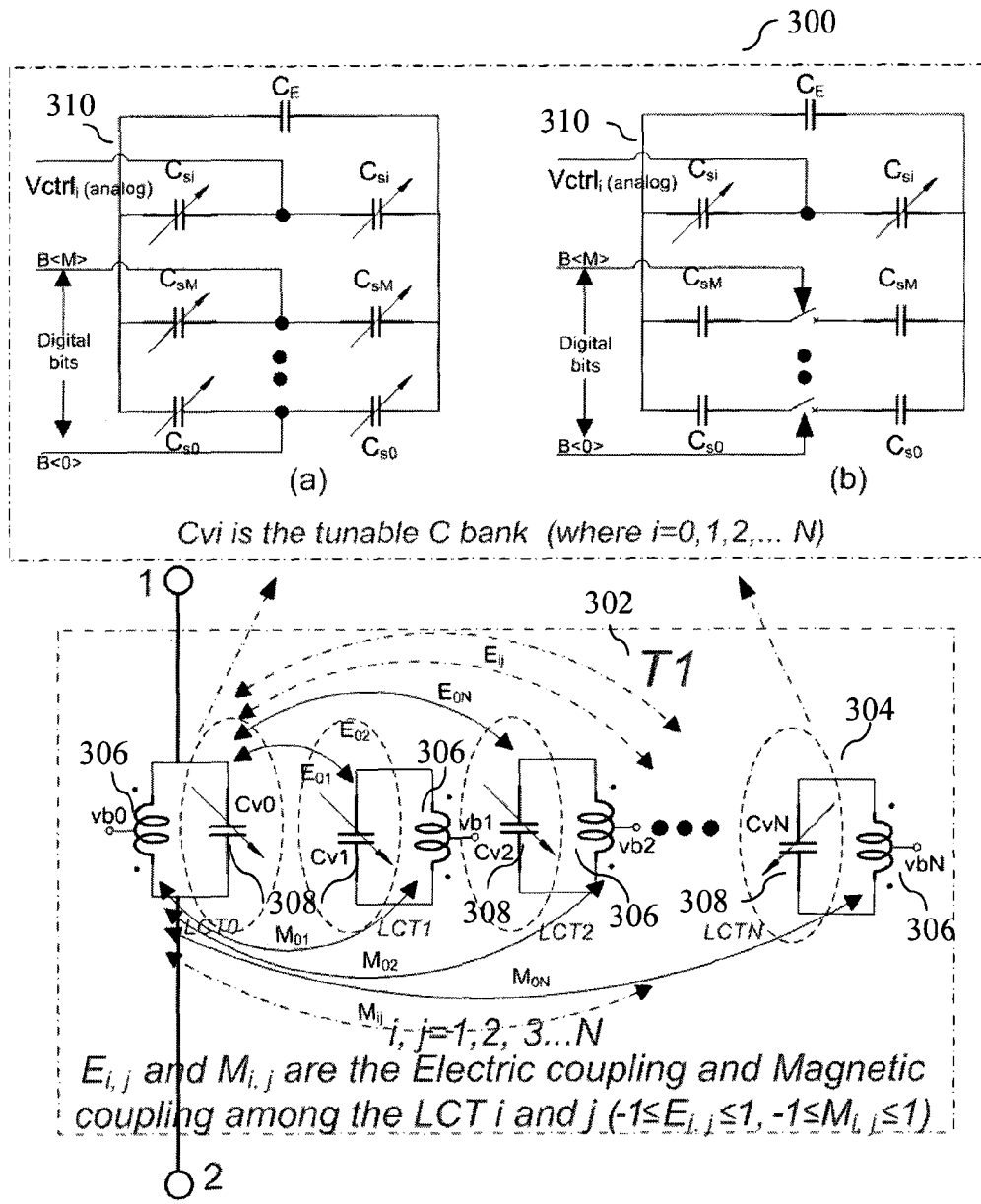
FIG. 3 is a circuit diagram depicting a strong magnetic and electric coupled LC tank circuit architecture in accordance with a present embodiment.

Referring to FIG. 3, a circuit diagram 300 depicts a hybrid coupled LC tank array (T1) 302 in accordance with the present embodiment. The tank circuit 302 includes a plurality of LC tank circuits 304 both electrically and magnetically coupled to one another. Each of the LC tank circuits 304 includes an inductor 306 and a capacitive device 308, and the electrical coupling is between the capacitive devices 308 of each of the LC tank circuits 304 while the magnetic coupling is between the inductors 306 of each of the LC tank circuits 304. The capacitive devices 308 include one or more tunable capacitor banks 310 as shown in (a) or (b).

FIGS. 1 to 3 depict the basic principle and operation of the coupled LC tank circuits 104, 204, 304. Common to all three types of coupling, the LC tank circuits 104, 204, 304 are split into primary and secondary. The LC tank circuit LCT0 which is represented with connection points 1 and 2 in FIGS. 1 to 3 is the primary LC tank circuit and all other LC tank circuits are treated as secondary LC tank circuits. The capacitive device(s) 108, 208, 308 in combination with the inductors 106, 206, 306 can be any combination of capacitive networks, such as the tunable capacitor banks 110, 210, 310.

For magnetic coupling as depicted in FIG. 1, the magnetic field generated in the primary LC tank circuit LCT0 due to the current flow can be effectively coupled to N secondary LC tank circuits LCT1 to LCTN (N≥1). For electrical coupling as depicted in FIG. 2, the electrical coupling is by capacitor networks 208 which are coupled to each other and represented in the pi fashion with a coupling capacitor. Hybrid Coupling is shown in FIG. 3, were the coupling is a combination of magnetic coupling by the inductors 306 and electric coupling by the capacitive devices 308 which can be independent or a combination of both.

The performance of a voltage controlled oscillator (VCO) can be greatly optimized with any of the coupling mechanisms. The connection points 1 and 2 of the primary LC tank circuit can be connected to a VCO core replacing the single or differential inductor usually present in the tank circuit or resonator. The varactor $C_{v0}$ 108, 208, 308 in the primary LC tank circuit can be an analog tuning varactor in either a single end or differential structure, and is used to lock the VCO frequency to the output frequency when used as an integrated solution with phase locked loops and frequency synthesizers. In a standalone mode, the varactor is usually controlled by an external voltage.

The inductors 106, 206, 306 in the secondary LC tank circuits can be from 1 to N and can be coupled to the primary LC tank circuit of the VCO either magnetically or electrically or in a hybrid technique. The capacitive network can be common to both the primary and the secondary LC tank circuits. The capacitive network could be (a) varactors connected back to back in single or differential arrangements controlled by programmable settings or analog tuning of individual values or binary weighted values, or (b) capacitor(s) controlled by switch(es) connected in single ended or differential arrangements controlled by programmable settings of individual values or binary weighted values, or (c) any combination of (a) or (b) with analog tuning varactors, or (d) any combination of (a), (b) or (c) with either passive or active fixed capacitors coupled in series or parallel or any other combination. For the secondary LC tank circuits, the function of the varactors can be interchangeable between coarse and fine tuning with a variation of bias in the secondary LC tank circuits. These varactors in combination with the LC tank circuits act to shift the VCO frequency up or down in the vicinity of an operation frequency without a switch.

The possible connections of capacitive network components in either the primary LC tank circuits or the secondary LC tank circuits can be the varactor(s) or capacitor(s) controlled by switch(es) 110, 210, 310 as shown in FIGS. 1 to 3 ((a) or (b)) coupled back to back in single or in differential structures and controlled by programmable settings or analog tuning of individual values or binary weighted values. The number of varactors or capacitor(s) can be single or multiple ($C_{S0}$ to $C_{SM}$) coupled back to back in digital fashion with input digital control being coupled to the common node in the case of varactors and being coupled to the switch in the case of capacitor(s) controlled by switch(es). The number of bits is limited by the performance parameter chosen and the desired application (as shown in 110, 210, 310).

In addition to varactors $C_{S0}$ to $C_{SM}$ being controlled in a digital manner as described in the schemes hereinabove, the varactor $C_{Si}$ connected back to back in a single or a differential arrangement can be controlled by analog voltage $Vctrl_i$. Analog voltage $Vctrl_i$ can be a predetermined voltage or can be coupled together with the Vctrl of the primary tuning varactor to further extend the frequency tuning range of the VCO. Capacitor $C_E$ is used to enhance the operation frequency shifting and phase noise performance of the VCO, since the capacitor typically has a much higher quality factor than the varactors.

The amount of performance parameters is determined by the strength of the coupling between the primary LC tank circuit and the N secondary LC tank circuits (N≥1). The coupling can also improve the quality of the LC tank circuit, a factor which is important in maintaining a low phase noise along with high tunability. The widest tuning range achievable can also be controlled by the number of capacitive tuning elements coupled in the LC tank array, which is based on the desired application and other performance parameters.

The proposed structures are part of RF/Microwave/Millimeter-wave circuits for frequency generation. Such frequency generation sources usually consist of a VCO with a narrow or moderate tuning range and with optimum phase noise and a single LC tank for frequency tuning. Wideband tuning in accordance with the present embodiment(s) is achieved by magnetic or electric or hybrid coupling between different LC tanks without any switch. Frequency generation sources in accordance with the present embodiment(s) can be utilized in the design of millimeter-wave wideband injection locked frequency dividers intended for use in wireless communication applications.

Typically at RF/Microwave/millimeter-wave frequencies, dividers (divide by 2, 3, 4, 5 and so on) are implemented using injection locked techniques for the first and following stages to reduce power consumption. These dividers typically include a tank circuit comprised of inductors and capacitors which acts as a band pass filter at the desired output frequency in accordance with the division ratio used. Tank circuits formed by the parallel combination of inductance and capacitance play an important role in defining the locking range of these dividers. Typically, a wide locking range is constrained by the input power and the tuning range of the ILFD in free-running mode. Thus, a wide tuning range is generally achieved by varying the capacitance of the tank circuit using some kind of switching element. The LC tank circuits of FIGS. 1 to 3 particularly relate to design of an ILFD which can achieve a wider locking range by increasing the range of the ILFD's free running mode for best performance with optimum tradeoff, and is particularly suitable for next generation wireless applications.

Figure 4A:
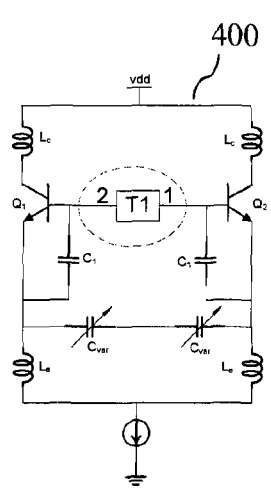
FIGS. 4A, 4B and 4C, are circuit diagrams of voltage controlled oscillator circuits in accordance with another present embodiment.
Figure 4B:
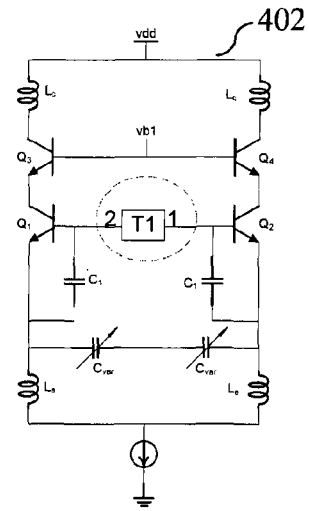
Figure 4C:
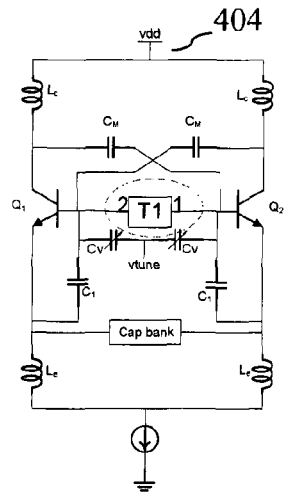

Referring to FIGS. 4A, 4B and 4C, three bipolar VCOs 400, 402, 404 using the strongly coupled LC tanks (T1) of FIGS. 1 to 3 are illustrated. In FIGS. 4A, 4B and 4C, T1 can be magnetic or electric or hybrid coupled LC tank circuits as presented in FIGS. 1 to 3, respectively. Nodes 1 and 2 are the main connection nodes for T1 to other portion of VCO. The strongly coupled LC tank circuits can be used in any of the VCOs 400, 402, 404.

The VCO 400 uses a Colpitts architecture with a common collector configuration. The proposed LC tank circuits T1, incorporating the capacitor $C_1$ and the varactor $C_{var}$, would comprise the VCO core resonator of the VCO 400. The VCO 402 has the same architecture as the VCO 400 with additional PNP transistors $Q_3$ and $Q_4$. The VCO 404 adds an additional base-collector decoupling capacitor $C_M$. The current sources in the VCOs 400, 402, 404 can be any type or current source and can also be a resistor in series or parallel or any combination thereof. The strongly coupled LC tank circuits of FIGS. 1 to 3 can be used to advantage in many of the current VCO architectures and, as such, the use of the strongly coupled LC tank circuits of FIGS. 1 to 3 is not limited to the VCOs 400, 402, 404.

Figure 5A:
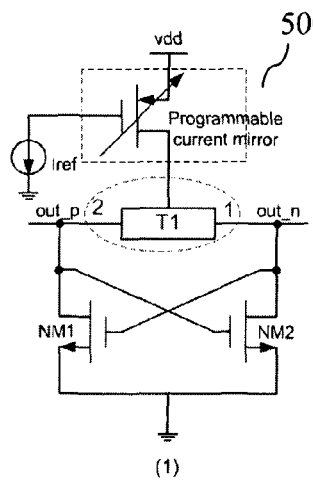
FIGS. 5A, 5B and 5C, are circuit diagrams of voltage controlled oscillator circuits in accordance with the present embodiment.
Figure 5B:
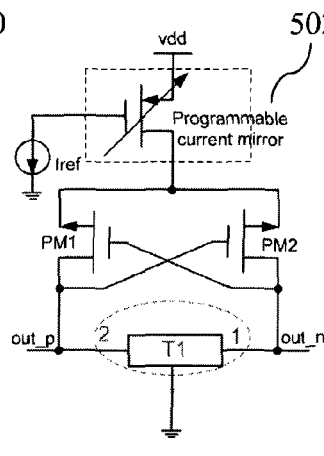
Figure 5C:
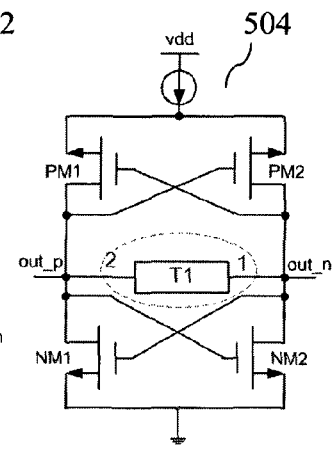

FIGS. 5A, 5B and 5C, are circuit diagrams 500, 502 and 504 of CMOS voltage controlled oscillator circuits in accordance with the present embodiment using the strongly coupled LC tanks of FIGS. 1 to 3. In the circuit diagrams 500, 502, 504, T1 can be magnetic or electric or hybrid coupled LC tanks as discussed in FIGS. 1 to 3, respectively. As in FIGS. 4A, 4B and 4C, nodes 1 and 2 are the main connection nodes for T1 to other portion of VCO.

The strongly coupled LC tank circuits can be used in the CMOS VCO 500 with a cross-coupled NMOS transistor pair. In the CMOS VCO 502, the strongly coupled LC tank circuits can be used with a cross-coupled PMOS transistor pair. And in the CMOS VCO 504, the strongly coupled LC tank circuits can be used with a compensated cross-coupled NMOS transistor pair and PMOS transistor pair. All three VCOs 500, 502, 504 use a PMOS current source. The strongly coupled LC tank circuits of FIGS. 1 to 3 can also be used in CMOS VCOs with a NMOS current source. The current sources (PMOS or NMOS) may be programmable or not programmable; they can also be replaced by a resistor in series or parallel or any combination thereof. The strongly coupled LC tank circuits of FIGS. 1 to 3 can also be used in most current VCO architectures, and thus are not limited to the CMOS implementations of the VCOs 500,502,504 shown in FIG. 5.

Figure 6:
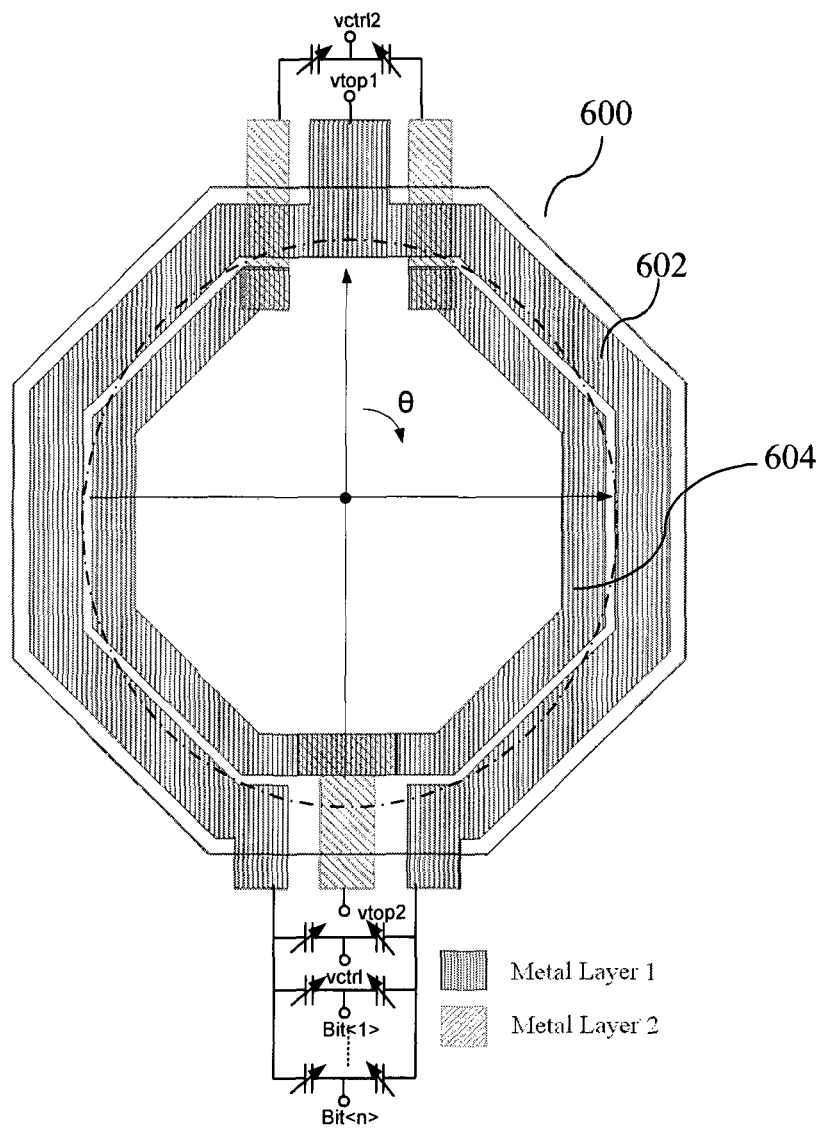
FIG. 6 is a top planar view illustrating a first two metal layer integrated circuit architecture of LC tanks for a voltage controlled oscillator circuit in accordance with the present embodiment.

FIG. 6 is a top planar view 600 illustrating a first two metal layer integrated circuit architecture of strongly magnetic coupled LC tank circuits for a voltage controlled oscillator circuit in accordance with the present embodiment. The outer coil 602 incorporates bottom tuning varactors and a varactor bank for the primary LC tank circuit. The tuning varactor is controlled by Vctrl. The varactor bank is controlled by Bit<1> to Bit<n> (where n is integer). The inner coil 604 includes top tuning varactors acting as secondary LC tank circuits. The top tuning varactors are controlled by Vctrl2. Vctrl2 can be a predetermined voltage; in addition, Vctrl2 can be connected together with Vctrl of the primary tuning varactor. The secondary LC tank circuits can have other forms as defined by the rotation through any angle of θ (i.e., from 0 to 2π and with no overlap with the primary coil). Further, the inductor shape is not limited to an octagonal shape—it can also be in the form of a rectangular, a circle or a hexagon. The strongly coupled LC tank circuits are not limited to two tank circuits. The inductors of the secondary or tertiary or N LC tank circuits can have forms of inner coils, outer coils, bottom coils, and/or top coils or any combination thereof when formed by stacked metal layers.

Figure 7:
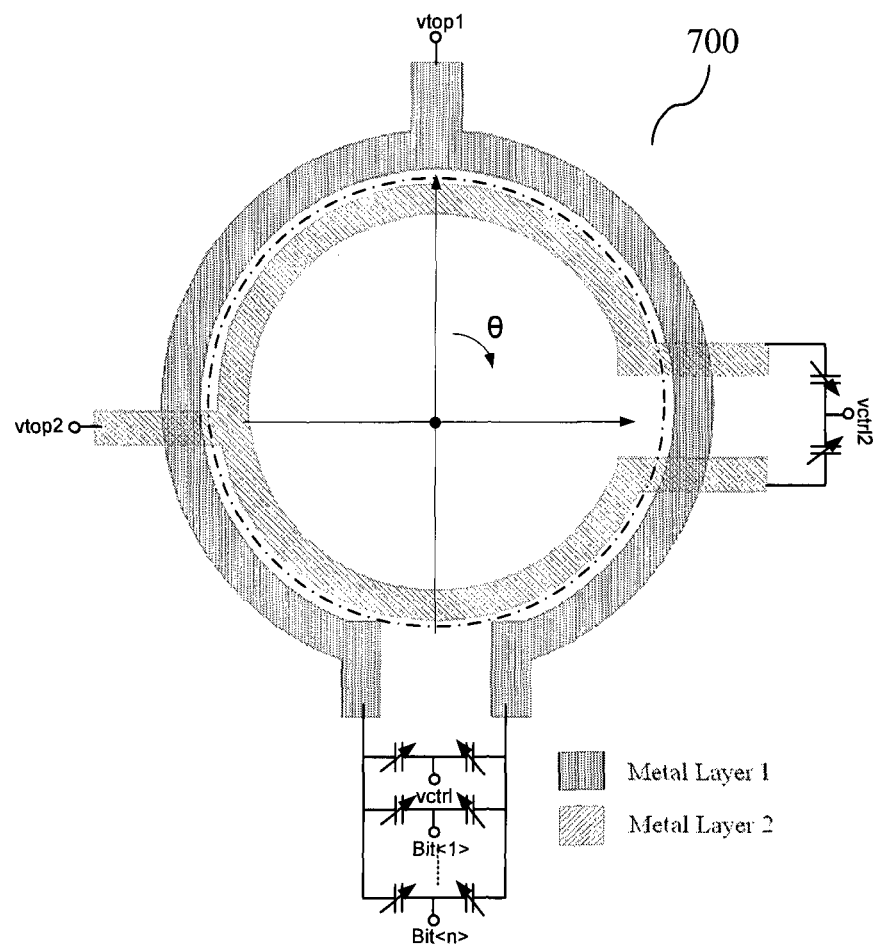
FIG. 7 is a top planar view illustrating a second two metal layer integrated circuit architecture of LC tanks for a voltage controlled oscillator circuit in accordance with the present embodiment.

FIG. 7 is a top planar view 700 illustrating a second two metal layer integrated circuit architecture of magnetic coupled LC tank circuits for a voltage controlled oscillator circuit in accordance with the present embodiment. The coils are in the form of circles. The secondary LC tank circuit rotates π/2. It can also have other forms, rotating with any angle of θ from zero to 2π. The control signal illustration is the same as FIG. 6.

Figure 8:
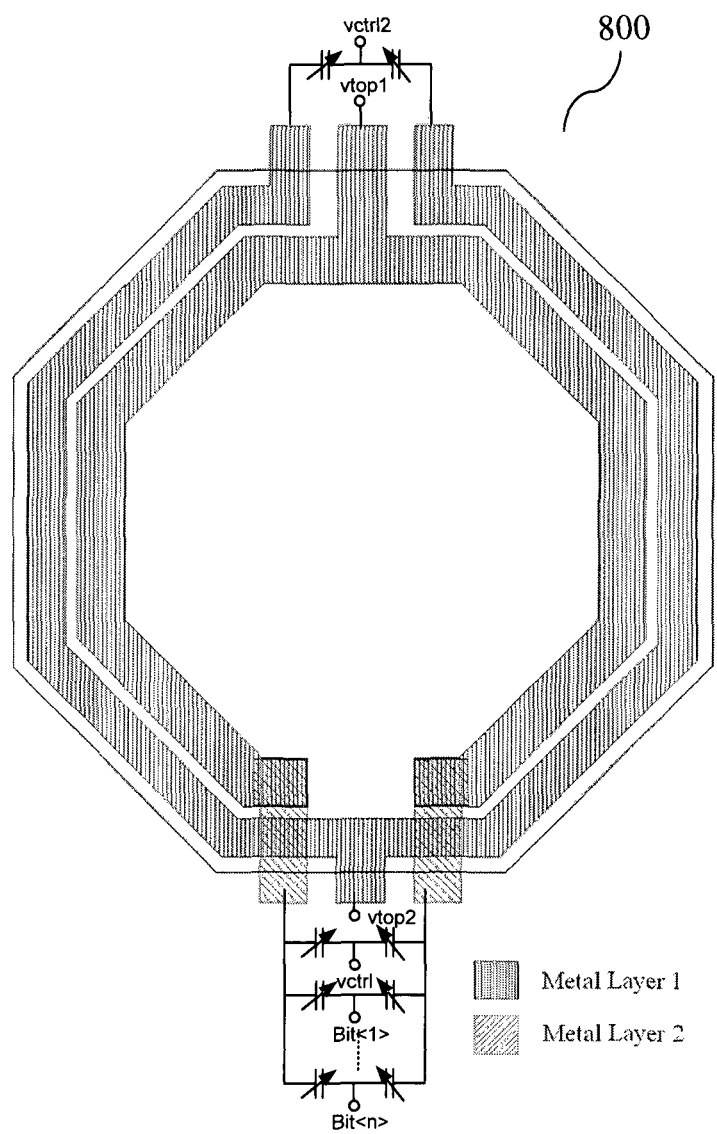
FIG. 8 is a top planar view illustrating a third two metal layer integrated circuit architecture of LC tanks for a voltage controlled oscillator circuit in accordance with the present embodiment.

FIG. 8 is a top planar view 800 illustrating a third two metal layer integrated circuit architecture of strongly magnetic coupled LC tank circuits for a voltage controlled oscillator circuit in accordance with the present embodiment. The outer coil includes the top tuning varactor acting as the secondary LC tank. The control signal illustration is also the same as FIG. 6.

Figure 9:
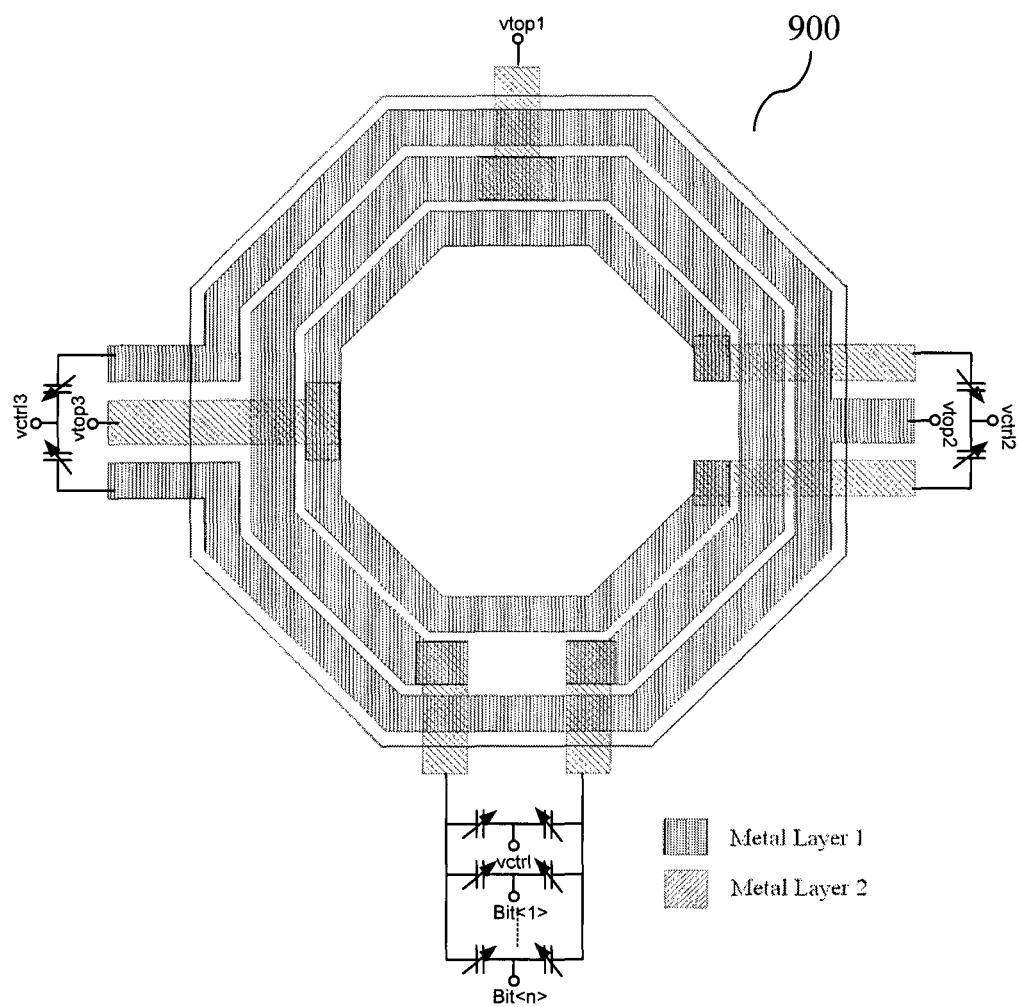
FIG. 9 is a top planar view illustrating a fourth two metal layer integrated circuit architecture of LC tanks for a voltage controlled oscillator circuit in accordance with the present embodiment.

FIG. 9 is a top planar view 900 illustrating a fourth two metal layer integrated circuit architecture of strongly magnetic coupled LC tanks for a voltage controlled oscillator circuit in accordance with the present embodiment. The inner coil includes a right-side tuning varactor acting as the secondary LC tank. The outer coil includes a left-side tuning varactor acting as another secondary LC tank. The control signal illustration is also the same as FIG. 6.

Figure 10:
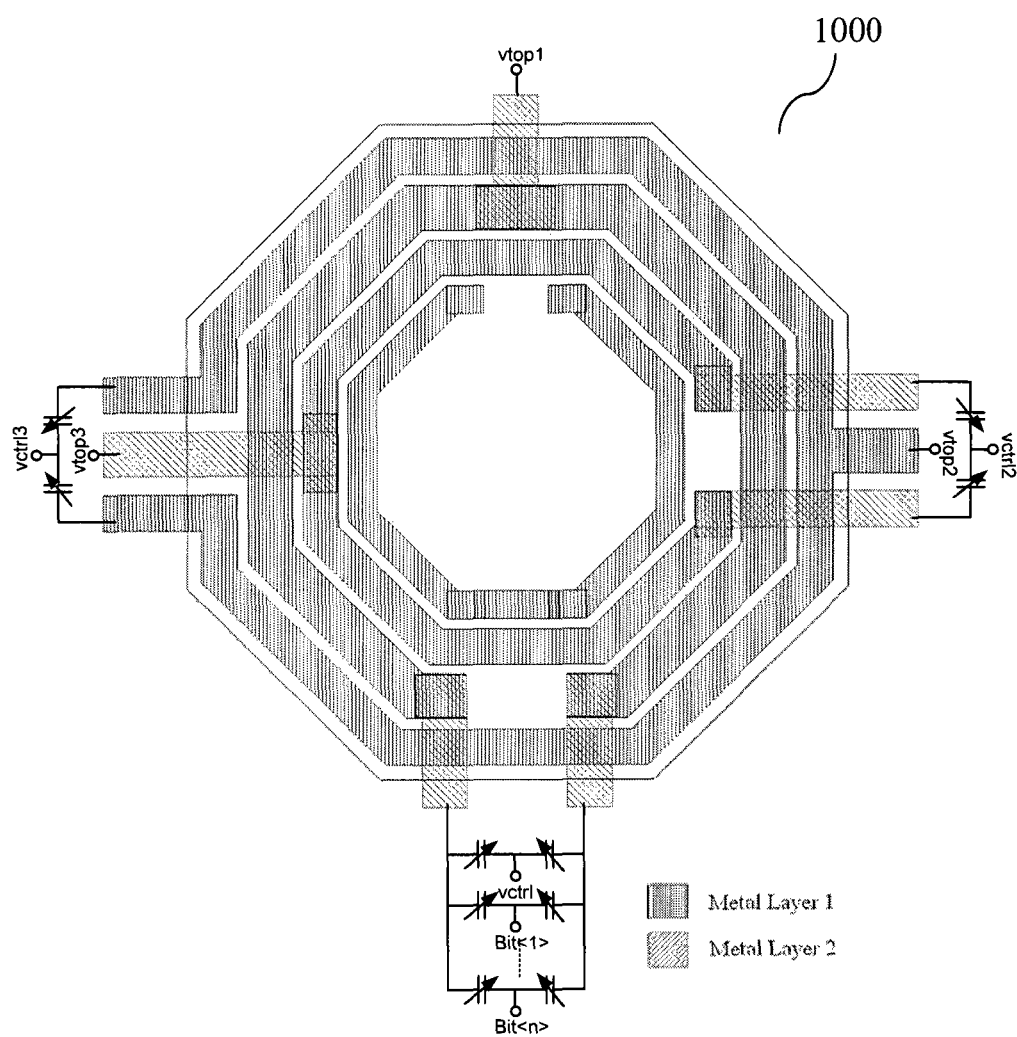
FIG. 10 is a top planar view illustrating a fifth two metal layer integrated circuit architecture of LC tanks for a voltage controlled oscillator circuit in accordance with the present embodiment.

FIG. 10 is a top planar view 1000 illustrating a fifth two metal layer integrated circuit architecture of strongly magnetic coupled LC tank circuits for a voltage controlled oscillator circuit in accordance with the present embodiment. The top planar view 1000 has one more floating inner coil than FIG. 9. The floating inner coils are not limited to one. In addition, they can be in the form of outer floating coils or any stacked metal layer coils.

Figure 11:
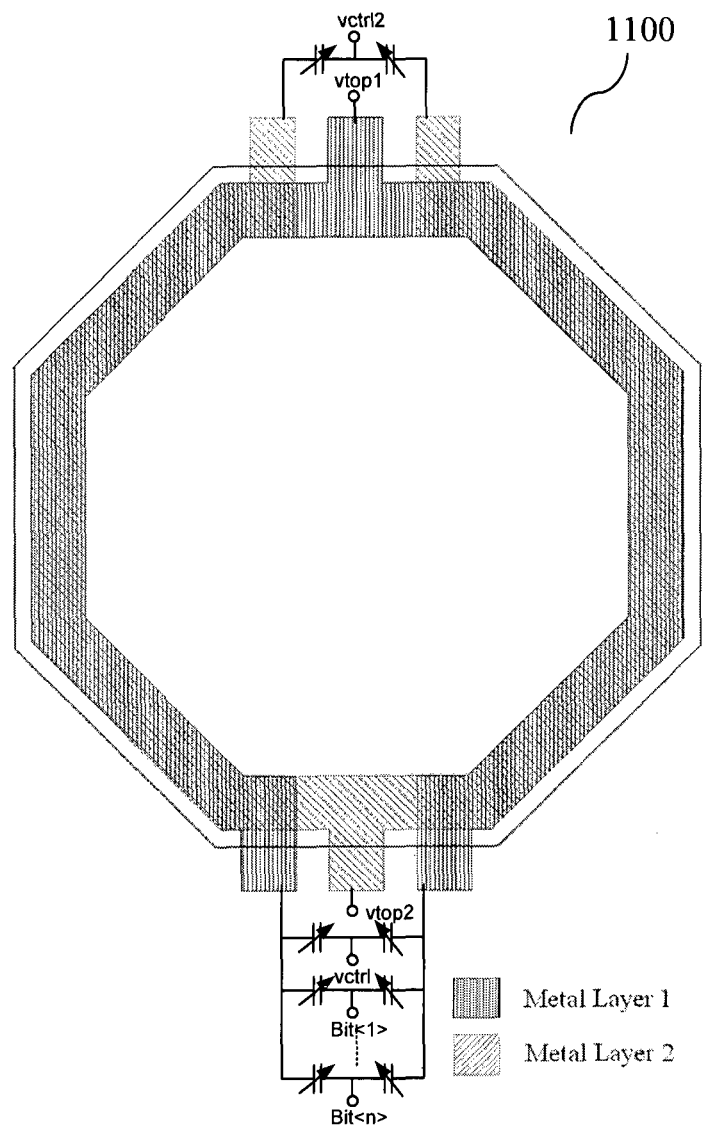
FIG. 11 is a top planar view illustrating a sixth two metal layer integrated circuit architecture of LC tanks for a voltage controlled oscillator circuit in accordance with the present embodiment.

Referring to FIG. 11, a top planar view 1100 illustrates a sixth two metal layer integrated circuit architecture of strongly magnetic coupled LC tank circuits for a voltage controlled oscillator circuit in accordance with the present embodiment. The two inductors are in the form of stacked metal coils. The bottom metal coil includes the up-side tuning varactor acting as the secondary LC tank. The control signal illustration is also the same as FIG. 6.

Figure 12:
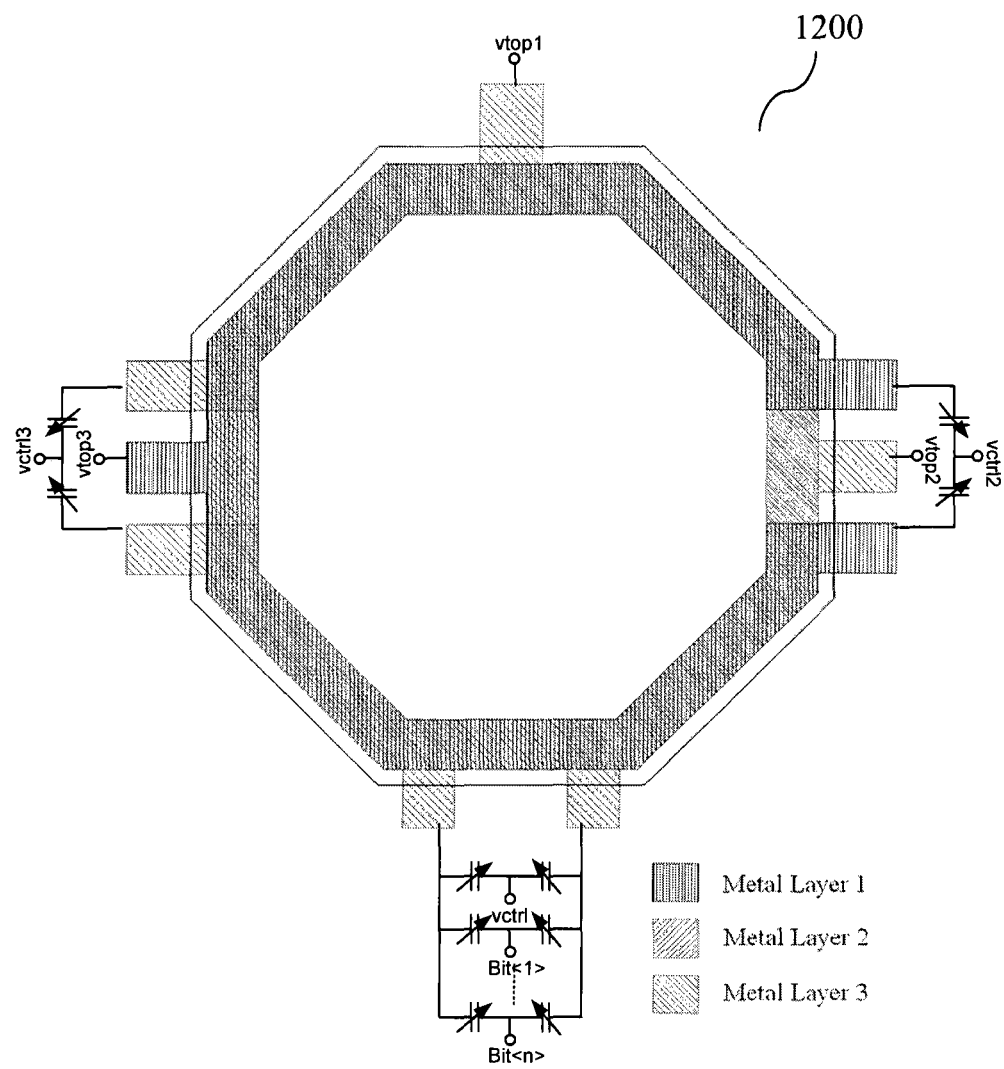
FIG. 12 is a top planar view illustrating a first three metal layer integrated circuit architecture of LC tanks for a voltage controlled oscillator circuit in accordance with the present embodiment.

FIG. 12 is a top planar view 1200 illustrating a three metal layer integrated circuit architecture of strongly magnetic coupled LC tank circuits for a voltage controlled oscillator in accordance with the present embodiment. The three inductors are in the form of stacked metal coils. The bottom metal coil includes a right-side tuning varactor acting as the secondary LC tank. Another secondary LC tank is formed by a top metal coil and a left-side tuning varactor. The primary inductor is a second top metal coil. It will be recognized by those skilled in the art that the stacked metal layers are not limited to three. The control signal illustration is also the same as FIG. 6.

Figure 13:
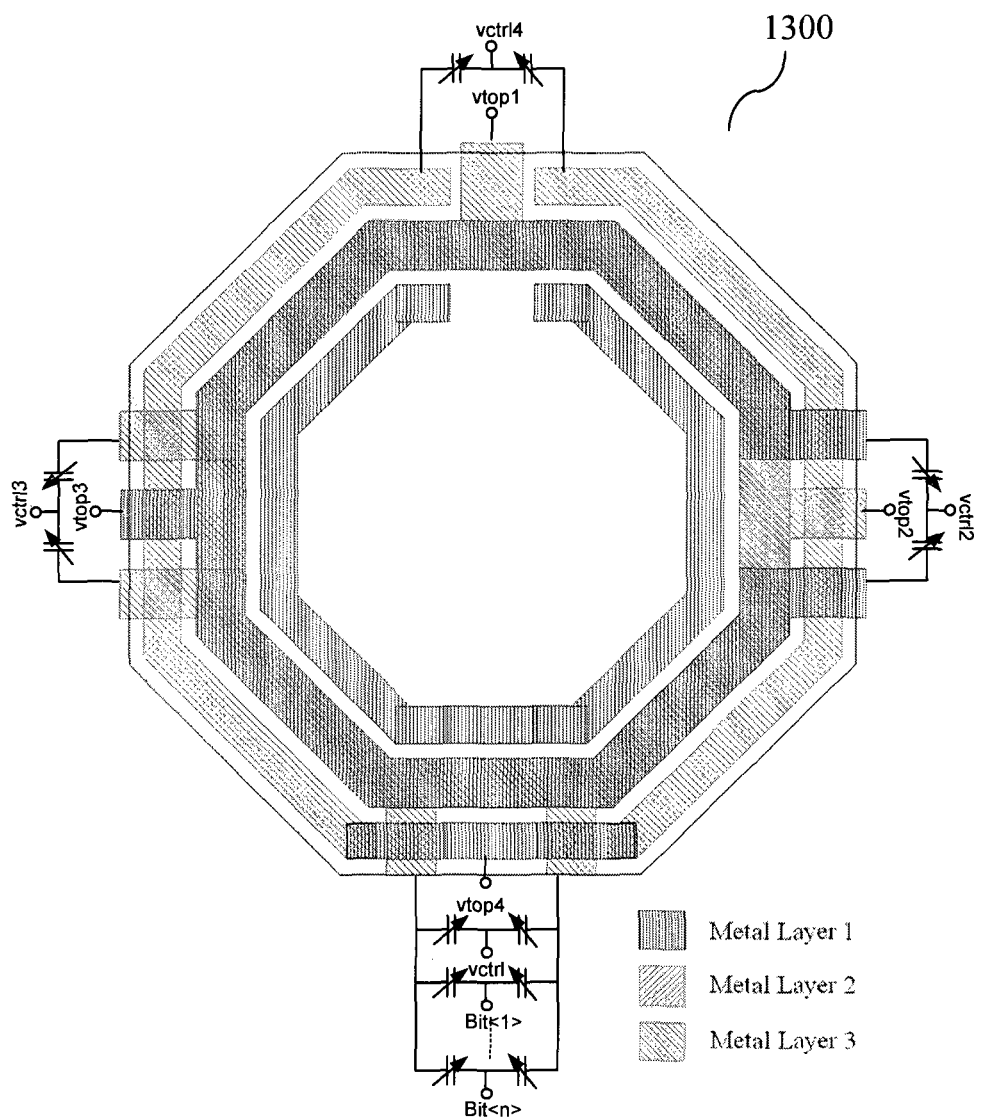
FIG. 13 is a top planar view illustrating a second three metal layer integrated circuit architecture of LC tanks for a voltage controlled oscillator circuit in accordance with the present embodiment.

FIG. 13 is a top planar view 1300 illustrating a second three metal layer integrated circuit architecture of strongly magnetic coupled LC tank circuits for a voltage controlled oscillator in accordance with the present embodiment. The LC tank circuits are a combination of stacked metal layer inductors and inner/outer coils. The inner/outer coils can also have the form of stacked metal layers or any metal layers. The inner/outer coils are also not limited to one coil. Besides the primary coil, all the other coils can be used as coupled LC tanks incorporating varactors, and some of them can be floating.

Figure 14:
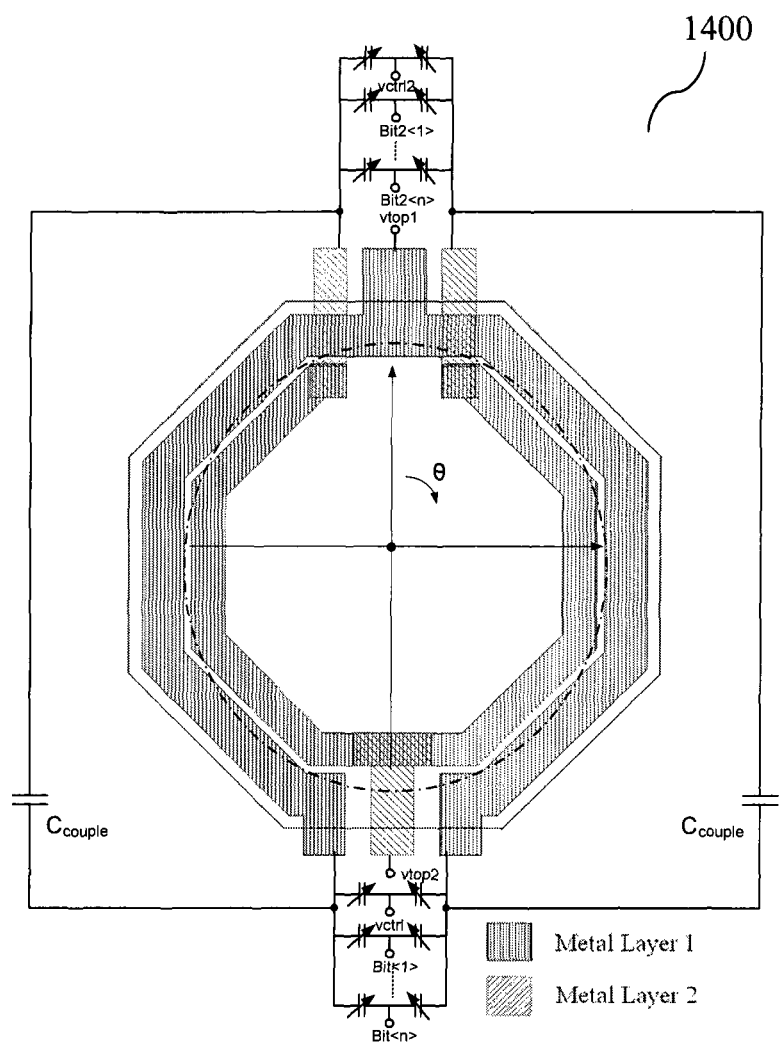
FIG. 14 is a top planar view illustrating a seventh two metal layer integrated circuit architecture of LC tanks for a voltage controlled oscillator circuit in accordance with the present embodiment.
Figure 15:
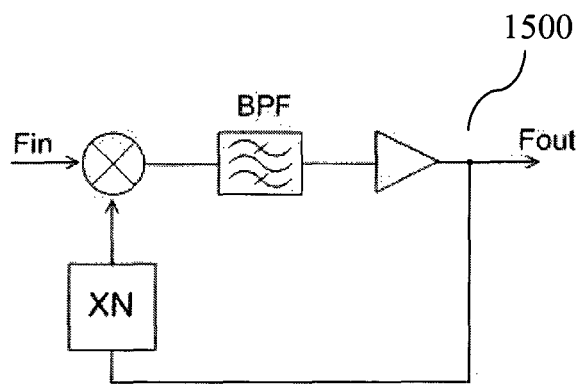
FIG. 15 is a circuit diagram depicting an injection locked frequency divider circuit architecture in accordance with another present embodiment.

Referring to FIG. 14, a top planar view 1400 illustrates a seventh two metal layer integrated circuit architecture of hybrid coupled LC tank circuits for a voltage controlled oscillator in accordance with the present embodiment. Besides the magnetic coupling as illustrated in FIG. 6, there is additional electric coupling introduced by capacitor $C_{couple}$. The capacitor $C_{couple}$ can be one or more of fixed capacitors, variable capacitors, switchable capacitors, or any combination of fixed, variable and switchable capacitors. The control signal illustration is the same as FIG. 6. The secondary LC tank circuit(s) can have other forms, rotating with any angle of θ from 0 to 2π with no overlap with the primary coil. The inductor shape is not limited to octagonal as it can be in the form of a rectangle, a circle, a hexagon or any other geometric shape. The strongly coupled LC tank circuits are not limited to two tank circuits. The inductors of the secondary or tertiary or N LC tank circuit can have forms of inner coils, outer coils, bottom/top coils when in the form of stacked metals, or any combination thereof. FIG. 15 is a circuit diagram 1500 depicting an injection locked frequency divider (ILFD) circuit architecture in accordance with another present embodiment. The ILFD in the circuit diagram 1500 utilizes a novel technique for improving the locking range of the ILFDs. Some general solutions to the problem of optimizing the locking range of an ILFD is to decrease the quality factor (Q) of a tank circuit of a bandpass filter (BPF) of the ILFD, increase the injection efficiency, increase the range of a free running ILFD by varying the capacitance associated with the tank circuit, or in some cases by varying the inductors using a switch.

Figure 16:
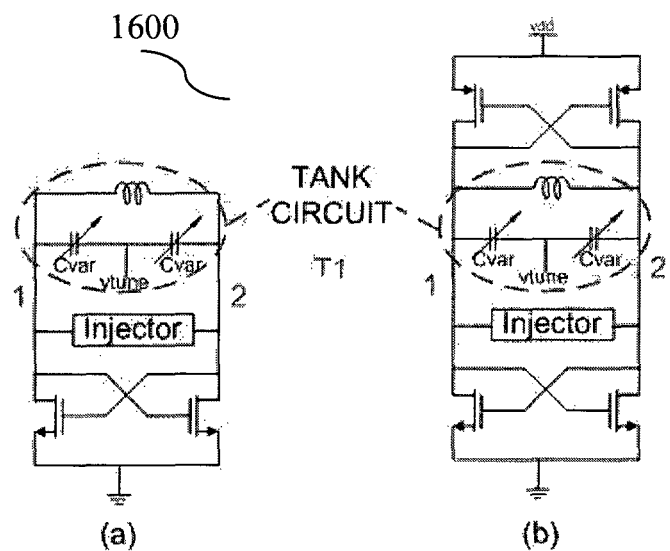
FIG. 16, comprising
Figure 17:
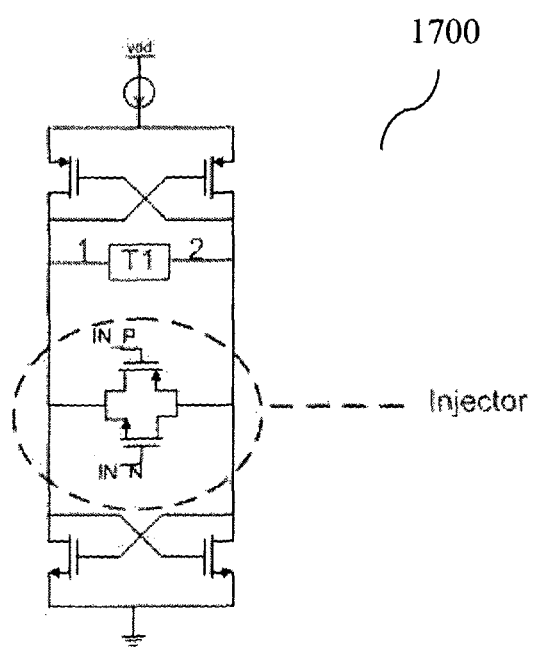
FIG. 17 is a circuit diagram depicting another injection locked frequency divider circuit architecture in accordance with the present embodiment.

A more optimized solution as presented in the alternate embodiment of FIGS. 15 to 17, is to optimally tune the inductor and capacitor of the tank circuit(s) without a switch and, instead, through magnetic or electric coupling or both (hybrid coupling) in LC tank circuits. The number of LC tank circuits that can be coupled in the BPF can be from 2 to N, where N is synonymous with the division ratio (e.g., 2, 3, 4, 5) of the ILFD. The BPF is operates as a band pass filter operation, and such operation is achieved by a LC tank circuit in a circuit level implementation in accordance with the present embodiment as disclosed in any of FIGS. 1 to 3.

Referring to FIG. 16, comprising FIGS. 16A and 16B, circuit diagrams 1600 of two additional injection locked frequency divider circuits in accordance with the present embodiment are depicted. FIGS. 16A and 16B show two possible implementations of ILFDs. The injector can be of a single or a multiple transistor type with any possible combinations placed in the above location. The region of interest is the implementation of the tank circuit as marked in 1600 and not the actual implementations of the ILFDs.

FIG. 17 is a circuit diagram 1700 depicting another injection locked frequency divider circuit architecture in accordance with the present embodiment. The circuit diagram 1700 shows an implementation of an ILFD in CMOS complementary MOSFET architecture using the strongly coupled LC tanks as illustrated in FIG. 1, 2 or 3. In the circuit diagram 1700, T1 can be magnetic or electric or hybrid coupled LC tanks and nodes 1 and 2 are the main connection nodes for T1 and other portion of the ILFD. The strongly coupled LC tanks of FIGS. 1 to 3 can be used in any ILFD which has a tank circuit made of an inductor and capacitor(s).

Figure 18:
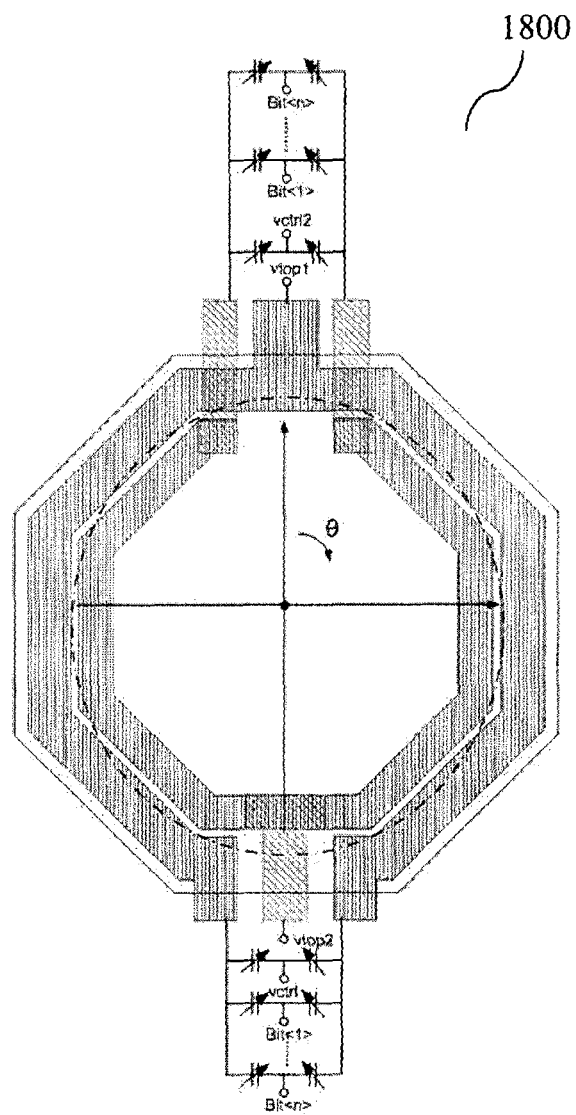
FIG. 18 is a top planar view illustrating a first two metal layer integrated circuit architecture of LC tanks for an injection locked frequency divider circuit in accordance with the present embodiment.

FIG. 18 is a top planar view 1800 illustrating a first two metal layer integrated circuit architecture of LC tanks for an injection locked frequency divider circuit in accordance with the present embodiment.

Thus it can be seen that an integrated circuit architecture for RF circuits which provides VCOs which address the performance issues of VCOs individually while providing an improved oscillator circuit which can concurrently meet the requirements of high performance has been provided. In addition, the integrated circuit architecture for RF circuits also provides ILFDs with broadened operating frequency ranges while maintaining the low phase noise and low power consumption of conventional ILFDs. While several exemplary embodiments have been presented in the foregoing detailed description of the invention, it should be appreciated that a vast number of variations exist.

It should further be appreciated that the exemplary embodiment or exemplary embodiments are only examples, and are not intended to limit the scope, applicability, dimensions, or configuration of the invention in any way. Rather, the foregoing detailed description will provide those skilled in the art with a convenient road map for implementing an exemplary embodiment of the invention, it being understood that various changes may be made in the function and arrangement of elements and operation of the circuitry described in an exemplary embodiment without departing from the scope of the invention as set forth in the appended claims.

What is claimed is:

1. An injection locked frequency divider having a predetermined frequency division ratio and comprising:
   a primary LC tank circuit comprising a first inductor (L) and a first capacitive device (C) coupled in parallel; and
   one or more secondary LC tank circuits, each comprising an inductor (L) and a capacitive device (C) coupled in parallel, wherein each of the one or more secondary LC tank circuits is coupled to the primary LC tank circuit for band pass filtering an input frequency to generate an output frequency filtered in accordance with the predetermined frequency division ratio;
   wherein the predetermined frequency division ratio is based on a quantity of secondary LC tank circuits;
   wherein the injection locked frequency divider is tunable through at least one of magnetic or electric coupling between the primary LC tank circuit and the one or more secondary LC tank circuits.

2. The injection locked frequency divider in accordance with claim 1 wherein each of the one or more secondary LC tank circuits is electrically coupled to the primary LC tank.

3. The injection locked frequency divider in accordance with claim 1 wherein each of the one or more secondary LC tank circuits is magnetically coupled to the primary LC tank.

4. The injection locked frequency divider in accordance with claim 1 wherein each of the one or more secondary LC tank circuits is both electrically and magnetically coupled to the primary LC tank.

5. The injection locked frequency divider in accordance with claim 1 wherein the one or more secondary LC tank circuits comprises two or more LC tank circuits, and wherein each of the two or more secondary LC tank circuits is coupled to each other and coupled to the primary LC tank circuit.

6. The injection locked frequency divider in accordance with claim 1 wherein said capacitive device of each of the LC tank circuits, including said primary LC tank and said one or more secondary LC tank circuits, comprises one or more tunable capacitor banks.

* * * * *